United States Patent [19]

Adachi et al.

[11] Patent Number: 5,306,947
[45] Date of Patent: Apr. 26, 1994

[54] SEMICONDUCTOR DEVICE AND MANUFACTURING METHOD THEREOF

[75] Inventors: Hiroshi Adachi; Hirozoh Kanegae; Hiroshi Mochizuki; Masanori Obata; Takemi Endoh; Kimio Hagi; Shigeru Harada; Kazuhito Matsukawa; Akira Ohhisa; Etsushi Adachi, all of Hyogo, Japan

[73] Assignee: Mitsubishi Denki Kabushiki Kaisha, Tokyo, Japan

[21] Appl. No.: 2,398

[22] Filed: Jan. 13, 1993

[30] Foreign Application Priority Data

Jan. 16, 1992 [JP] Japan .................................. 4-5928

[51] Int. Cl.$^5$ .................... H01L 23/48; H01L 29/46; H01L 29/54; H01L 29/62
[52] U.S. Cl. ................................. 257/642; 257/635; 257/759
[58] Field of Search ............... 257/758, 752, 642, 643, 257/635, 637, 750, 759

[56] References Cited

U.S. PATENT DOCUMENTS

| | | | |
|---|---|---|---|
| 4,001,870 | 1/1977 | Saiki et al. | 257/643 |
| 4,328,262 | 5/1982 | Kurahashi et al. | 257/643 |
| 4,523,372 | 6/1985 | Balda et al. | 257/643 |
| 4,618,878 | 10/1986 | Aoyama et al. | 257/643 |

Primary Examiner—Rolf Hille
Assistant Examiner—S. V. Clark
Attorney, Agent, or Firm—Lowe, Price, Leblanc & Becker

[57] ABSTRACT

The present invention is mainly characterized by providing an even surface of an interlayer insulating film for insulating and isolating an upper interconnection and a lower interconnection from each other. A lower interconnection layer is provided on a semiconductor substrate, having a pattern of stepped portions. A silicon type insulating film is provided on the semiconductor substrate so as to cover the lower interconnection layer. A silicon ladder resin film is filled in recessed portions of the surface of the silicon type insulating film for making even the surface of the silicon type insulating film. An upper interconnection layer electrically connected to the lower interconnection layer through a via hole is provided on the silicon type insulating film. The silicon ladder resin film has the structural formula:

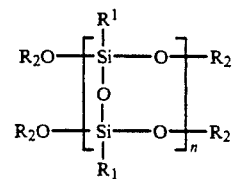

where $R_1$ is at least one of a phenyl group and a lower alkyl group, $R_2$ is at least one of a hydrogen atom and a lower alkyl group, and n is an integer of 20 to 1000.

7 Claims, 6 Drawing Sheets

SEMICONDUCTOR DEVICE AND MANUFACTURING METHOD THEREOF

BACKGROUND OF THE INVENTION

1. Field of the Invention

The present invention generally relates to semiconductor devices and, more particularly, relates to semiconductor devices having an even surface of an interlayer insulating film for insulating and isolating an upper layer interconnection and a lower layer interconnection from each other. The present invention further relates to a method of manufacturing such semiconductor devices.

2. Description of the Background Art

Figure 6:
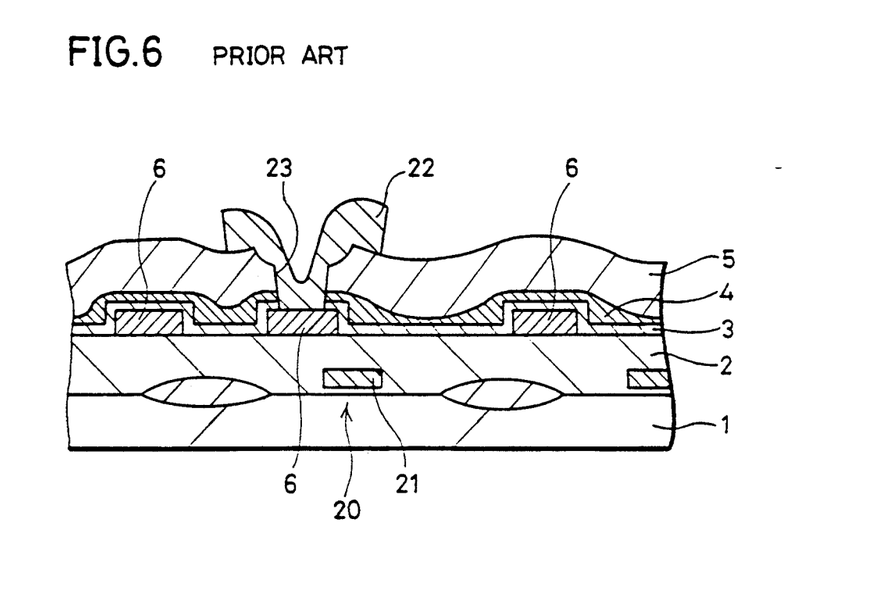
FIG. 6 is a cross-sectional view of a conventional semiconductor device.

FIG. 6 is a cross-sectional view of a semiconductor device having a conventional multilevel interconnection structure. Referring to FIG. 6, an element 20 is formed over a semiconductor substrate 1. An underlying insulating film 2 is formed over semiconductor substrate 1, covering element 20. Underlying insulating film 2 is formed of silicon type insulating film and has its surface made even by reflow (thermal treatment at about 900° C. or above). A gate, which is part of element 20, is formed of polysilicon and has large heat resistance. Therefore, the surface of underlying insulating film 2 can be made even by the reflow. If the interconnection layer is formed of aluminum which has inferior resistance to heat, such reflow treatment can not be employed.

A lower aluminum interconnection 6 (having inferior resistance to heat) is formed on underlying insulating film 2, having a pattern of stepped portions. A lower interlayer insulating film 3 is formed over semiconductor substrate 1, covering aluminum interconnection 6. Lower interlayer insulating film 3 is a silicon oxide film and formed by chemical vapor deposition (hereinafter referred to as CVD). Lower interlayer insulating film 3 is provided for preventing a crack in a spin on glass film (SOG film) to be formed later.

An SOG film 4 is formed on lower interlayer insulating film 3 for making even the surface of lower interlayer insulating film 3. An upper interlayer insulating film 5 is formed on SOG film 4. Upper interlayer insulating film 5 is a silicon oxide film and formed by CVD.

A via hole 23 is made in lower interlayer insulating film 3, SOG film 4 and upper interlayer insulating film 5, for exposing part of the surface of lower aluminum interconnection 6.

An upper aluminum interconnection layer 22 electrically connected to lower aluminum interconnection 6 through via hole 23 is provided on upper interlayer insulating film 5.

In the conventional semiconductor device as stated above, referring to FIG. 6, the surface having the pattern of recessed portions was made even, thereby obtaining an even surface of interlayer insulating film 5 by filling the recessed portions of the pattern with SOG film 4.

Figure 7:
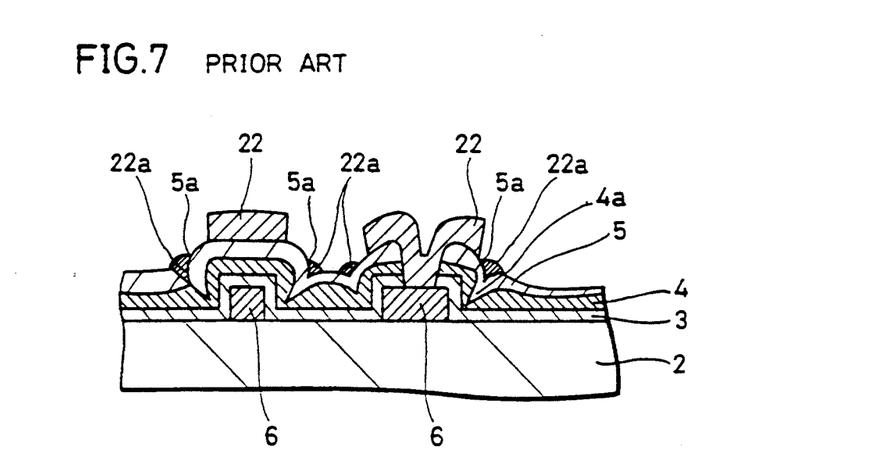
FIG. 7 is a cross-sectional view of a conventional semiconductor device for describing a problem caused when an SOG film is made thick.

However, referring to FIG. 7, if SOG film 4 is made thick in order to increase the degree of evenness, a crack 4a is caused in SOG film 4. If crack 4a is caused in SOG film 4, a valley 5a is formed on the surface of upper interlayer insulating film 5 to be formed on SOG film 4. An aluminum interconnection layer is formed on upper interlayer insulating film 5 and then the aluminum interconnection layer is patterned under such a condition, so that residue 22a of aluminum is left in valley 5a.

Residue 22a of aluminum was a cause of a short circuit. Also, crack 4a in SOG film 4 caused a problem that the surface of upper interlayer insulating film 5 was not made even.

Accordingly, SOG film 4 could not be formed thick in the conventional semiconductor device. If SOG film 4 can not be formed thick, it causes the following problems.

Referring to FIG. 7, if the distance between aluminum interconnections 6 is long (generally 10 μm above), the surface of interlayer insulating film 5 can not be evened. As a result, working accuracy of upper aluminum interconnection 22 is decreased, causing a short circuit or the like.

SUMMARY OF THE INVENTION

Therefore, an object of the present invention is to provide a semiconductor device where the surface of an interlayer insulating film for insulating and isolating an upper interconnection and a lower interconnection from each other is made even.

Another object of the present invention is to provide a semiconductor device where the surface of an interlayer insulating film is made even without using an SOG film.

Still another object of the present invention is to provide a method of making even the surface of an interlayer insulating film for insulating and isolating an upper interconnection and a lower interconnection from each other, which is different from a method of reflow.

Yet another object of the present invention is to provide a method in which the surface of an interlayer insulating film can be made even, even if the distance between lower interconnections is long.

Yet another object of the present invention is to provide a method in which the surface of an interlayer insulating film is made even and a decrease of dimensional accuracy of a via hole due to halation of ultraviolet rays can be avoided even if a lower interconnection layer is formed of a light-reflecting film.

In order to achieve the above-mentioned objects, a semiconductor device according to a first aspect of the present invention includes an interlayer insulating film for insulating and isolating a lower interconnection and an upper interconnection formed over the lower interconnection from each other. The semiconductor device includes a semiconductor substrate having an element formed thereon. A lower interconnection layer electrically connected to the above-mentioned element is formed on the semiconductor substrate, having a pattern of stepped portions. A silicon type insulating film is so provided on the semiconductor substrate as to cover the lower interconnection layer. Recessed portions exist on the surface of the above-mentioned silicon type insulating film, above regions between stepped portions of the pattern. A silicon ladder resin film having the following structural formula (1) is filled in the recessed portions of the silicon type insulating film, for making even the surface of the silicon type insulating film:

where $R_1$ is at least one of a phenyl group and a lower alkyl group, $R_2$ is at least one of a hydrogen atom and a lower alkyl group, and n is an integer of 20 to 1000.

A via hole is provided in the silicon type insulating film, for exposing part of the surface of the above-mentioned lower interconnection layer. An upper interconnection layer electrically connected to the lower interconnection layer through the via hole is provided on the silicon type insulating film.

A semiconductor device according to a second aspect of the present invention includes an interlayer insulating film for insulating and isolating a lower interconnection and an upper interconnection formed over the lower interconnection from each other. The device includes a semiconductor substrate with an element. A lower interconnection layer electrically connected to the element is formed on the semiconductor substrate. A silicon type insulating film is so provided on the semiconductor substrate as to cover the lower interconnection layer. There is provided a silicon ladder resin film having a UV absorbent added thereto and having the structural formula shown in the formula (1) above, covering the silicon type insulating film, for making even the surface of the silicon type insulating film. A via hole is provided extending through the silicon ladder resin film and the silicon type insulating film for exposing part of the surface of the lower interconnection layer. An upper interconnection layer electrically connected to the lower interconnection layer through the via hole is provided on the silicon ladder resin film.

A third aspect of the present invention is directed to a method of manufacturing a semiconductor device including an interlayer insulating film for insulating and isolating a lower interconnection and an upper interconnection formed over the lower interconnection, with a via hole being provided in the interlayer insulating film for connecting the lower interconnection and the upper interconnection. In this method, firstly, a semiconductor substrate including an element is prepared. A lower interconnection layer electrically connected to the element is formed on the semiconductor substrate, having a pattern of stepped portions. A silicon type insulating film is formed over the semiconductor substrate, covering the lower interconnection layer. On the surface of the silicon type insulating film exist recessed portions above regions between the stepped portions of the pattern. The silicon type insulating film is coated with a silicon ladder resin film having the structural formula (1) above so that the silicon ladder resin film is completely filled in at least the recessed portions in the surface of the silicon type insulating film. The silicon ladder resin film is etched back so that the silicon ladder resin film remains in the recessed portions on the surface of the silicon type insulating film, thereby making even the surface of the silicon type insulating film. The via hole is formed in the silicon type insulating film. An upper interconnection layer electrically connected to the lower interconnection layer through the via hole is formed on the silicon type insulating film.

A method according to a fourth aspect of the present invention is for manufacturing a semiconductor device including an interlayer insulating film for insulating and isolating a lower interconnection and an upper interconnection formed over the lower interconnection from each other. In this method, firstly, a semiconductor substrate including an element is prepared. A lower interconnection layer electrically connected to the element is formed on the semiconductor substrate, having a pattern of stepped portions. A silicon type insulating film is deposited on the semiconductor substrate, covering the lower interconnection layer. The silicon type insulating film has a thickness sufficient to insulate and isolate the lower interconnection and the upper interconnection from each other at least above the stepped portions of the pattern. On the surface of the silicon type insulating film exist recessed portions above regions between the stepped portions of the pattern. The silicon type insulating film is coated with a silicon ladder resin film having the formula (1) above so that the silicon ladder resin film is completely filled at least in the recessed portions stated above. The silicon ladder resin film is etched back and, furthermore, the silicon type insulating film is etched back to such an extent that the thickness of the silicon type insulating film is barely large enough to insulate and isolate the lower interconnection and the upper interconnection from each other, thereby forming a silicon type insulating film having an even surface. A via hole is formed in the silicon type insulating film, for exposing part of the surface of the lower interconnection layer. An upper interconnection layer electrically connected to the lower interconnection layer is formed on the silicon type insulating film.

A method according to a fifth aspect of the present invention is for manufacturing a semiconductor device including an interlayer insulating film for insulating and isolating a lower interconnection and an upper interconnection formed over the lower interconnection from each other and a via hole made in the interlayer insulating film for connecting the lower interconnection and the upper interconnection. In this method, firstly, a semiconductor substrate including an element is prepared. A lower interconnection layer electrically connected to the element is formed on the semiconductor substrate. A silicon type insulating film is so formed on the semiconductor substrate as to cover the lower interconnection layer. A silicon ladder resin film having the structural formula (1) above including a UV absorbent is formed to cover the silicon type insulating film in order to make even the surface of the silicon type insulating film. A photoresist is formed on the silicon ladder resin film. The photoresist is selectively irradiated with ultraviolet rays so that an aperture portion required for forming the via hole can be formed in the photoresist. The photoresist is then developed, thereby forming the aperture portion in the photoresist. The silicon ladder resin film and the silicon type insulating film is etched using the photoresist having the aperture portion formed therein as a mask, thereby forming the via hole penetrating the silicon ladder resin film and the silicon type insulating film. An upper interconnection layer electrically connected to the lower interconnection layer through the via hole is formed on the silicon ladder resin film.

In accordance with the semiconductor device according to the first aspect of the present invention, the silicon ladder resin film having the structural formula (1) is filled in the recessed portions in the silicon type insulating film, thereby making even the surface of the silicon type insulating film. As the surface of the silicon type insulating film serving as the interlayer insulating film is made even, the working accuracy of the upper interconnection layer is improved, so that a highly reliable semiconductor device is obtained.

In accordance with the semiconductor device according to the second aspect of the present invention, the silicon ladder resin film having the structural formula (1) is formed on the silicon type insulating film. Since the interlayer insulating film is formed of these films (the silicon type insulating film + the silicon ladder resin film), the surface of the interlayer insulating film becomes even. Also, as the UV absorbent is added into the silicon ladder resin film, a decrease in dimensional accuracy of the via hole due to halation of ultraviolet rays is not caused even if the lower interconnection is a highly reflecting film such as an aluminum interconnection and so on. As a result, a highly reliable semiconductor device is obtained.

In accordance with the method of manufacturing the semiconductor device according to the third aspect of the present invention, as the silicon ladder resin film having the structural formula (1) is filled in the recessed portions in the surface of the silicon type insulating film, an even surface of the silicon type insulating film (interlayer insulating film) is obtained.

In accordance with the method of manufacturing the semiconductor device according to the fourth aspect of the present invention, the silicon ladder resin film and the silicon type insulating film which have been formed thick are etched back, taking advantage of their characteristics of equal etching rates. As a result, an interlayer insulating film having an even surface can be obtained.

In accordance with the method of manufacturing the semiconductor device according to the fifth aspect of the present invention, the silicon ladder resin film has the UV absorbent added therein. Accordingly, even if a high reflecting film such as an aluminum interconnection layer exists under the silicon ladder resin film, there is no halation of ultraviolet rays caused in forming a via hole. As a result, the via hole can be formed with dimensional accuracy.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments according to the present invention will now be described below with reference to the accompanying drawings.

EMBODIMENT 1

FIG. 1 is a partial cross-sectional view of a semiconductor device showing each process in order in a manufacturing method according to one embodiment of the present invention.

Figure 1A:
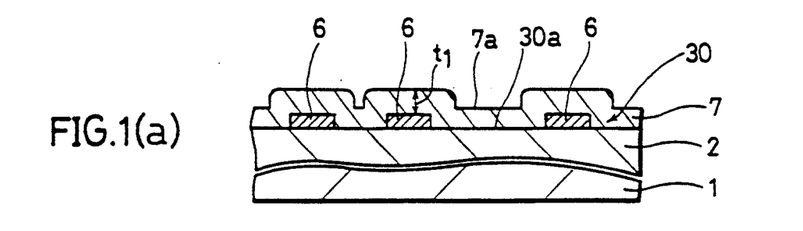
FIGS. 1(a)–(d) are a partial cross-sectional view of a semiconductor device showing each process in order in a manufacturing method according to one embodiment of the present invention.

Referring to FIG. 1(a), a semiconductor substrate 1 including an element (not shown) is prepared. An underlying insulating film 2 is formed on semiconductor substrate 1 as to cover the element. A lower interconnection layer (aluminum) 6 electrically connected to the element is formed on underlying insulating film 2, having a pattern 30 of stepped portions. The thickness of lower interconnection layer 6 is about 1 μm. A silicon type insulating film 7 such as a silicon oxide film is deposited by CVD so as to cover lower interconnection layer 6. In this embodiment, silicon type insulating film 7 serves as an interlayer insulating film. Silicon type insulating film 7 is so deposited that its thickness $t_1$ above the stepped portions of the pattern is 1 μm or above. The thickness of 1 μm is required for insulating and isolating lower interconnection layer 6 and an upper interconnection layer to be formed later from each other. Silicon type insulating film 7 includes a recessed portion 7a above a region 30a between the stepped portions of the pattern 30.

Figure 1B:
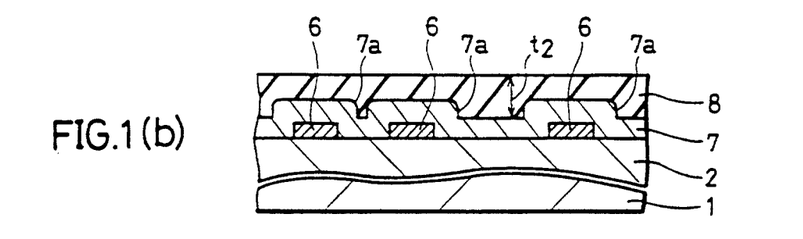

Referring to FIG. 1(b), silicon type insulating film 7 is coated with a silicon ladder resin film 8 so that the silicon ladder resin film is completely filled in the recessed portions on the surface of silicon type insulating film 7.

Silicon ladder resin film 8 includes a resin having the general formula (1):

where $R_1$ is at least one of a phenyl group and a lower alkyl group, $R_2$ is at least one of a hydrogen atom and a lower alkyl group, and n is an integer of 20 to 1000.

As the silicon ladder resin film, there are preferably used poly-phenyl-silsesquioxane (PPSQ), polyphenyl-vinyl-silsesquioxane, poly-phenyl-methylsilsesquioxane, poly-methyl-vinyl-silsesquioxane, polymethyl-silsesquioxane, poly-vinyl-silsesquioxane, or polyaryl-silsesquioxane, for example. In the formula, if n is less than 20, the film is not formed well while if n is beyond 1000, the film has inferior wet etching characteristics after formation.

Silicon ladder resin film 8 is formed on silicon type insulating film 7 to have a thickness of at least 2 μm above recessed portions 7a of silicon type insulating film 7. Then, silicon ladder resin film 8 is cured at the temperature of about 250° C. This curing makes even the surface of silicon ladder resin film 8.

Figure 1C:
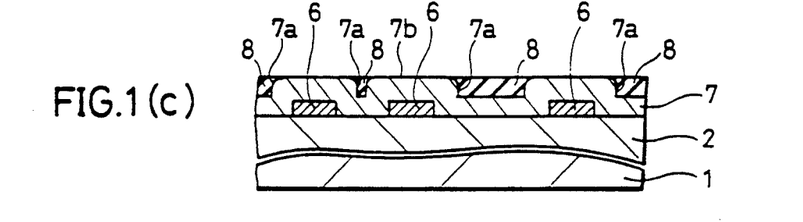

Referring to FIG. 1(b) and (c), silicon ladder resin film 8 is etched back by anisotropic etching so that silicon ladder resin film 8 remains in recessed portions 7a of silicon type insulating film 7 and there is no silicon ladder resin film left on stepped portions 7b of silicon type insulating film 7. The surface of silicon type insulating film 7 is thereby made even.

Figure 1D:
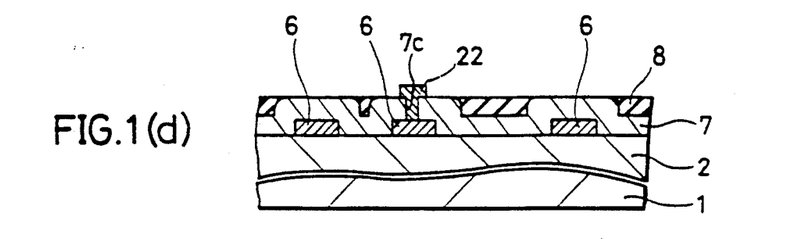

Referring to FIG. 1(d), a via hole 7c is formed in silicon type insulating film 7. Then, an upper interconnection layer 22 is formed on silicon type insulating film 7, which is electrically connected to lower interconnection layer 6 through via hole 7c.

In accordance with this embodiment, as the surface of silicon type insulating film 7 serving as an interlayer insulating film is flat, the accuracy of working upper aluminum interconnection 22 is improved.

Although a description has been made of a case where an aluminum interconnection is used as the lower interconnection in the embodiment above, the present invention is not limited to this and a polysilicon interconnection or a high melting point metal interconnection may be used.

Though the silicon oxide film has been shown as an example of the silicon type insulating film in the embodiment above, the present invention is not limited to this and a silicon nitride film or a silicon-oxy-nitride film may be used.

EMBODIMENT 2

Though a case has been shown where the anisotropic dry etching is used for etching back the silicon ladder resin film in the embodiment 1, the present invention is not limited to this. Silicon ladder type resin film 8 may be applied, having a thickness of 2 μm or above, then cured at a temperature of 250° C. or below and, successively, etched back by wet etching where an organic solvent such as anisole system, toluene system, xylene system or tetrahydrofuran system is used.

In wet etching, an important factor is a temperature at which the silicon ladder resin film is cured before being etched back. Table 1 shows the results of etching silicon ladder resin films which had been cured at various temperatures, using an anisole/xylene mixture solvent as the organic solvent. Resin films (PPSQ) which had been cured at a temperature of 250° C., 300° C. or 350° C. were used as silicon ladder resin films t-o be etched back. In table 1, the value of 10 μm/min, for example, represents an etching rate. Anisole/xylene mixture solvents were used with ratios of the anisole to the xylene in volume being 1:2 and 1:3.

As is obvious from table 1, it has been found that the higher the curing temperature is, the lower the etching rate becomes and when the curing temperature is 350° C., the etching rate is 0 μm/min. Accordingly, the temperature at which the silicon ladder resin film is cured should be 350° C. or below, preferably 250° C. or below.

| Etching Solution | Cure Temperature | | |
|---|---|---|---|
| | 250° C. | 300° C. | 350° C. |
| Anisole:xylene = 1:2 | 10 μm/min | 9 μm/min | 0 μm/min |
| Anisole:xylene = 1:3 | 5 μm/min | 4 μm/min | 0 μm/min |

EMBODIMENT 3

FIG. 2 is a partial cross-sectional view of a semiconductor device showing each process in order in a manufacturing method according to still another embodiment of the present invention.

Figure 2A:
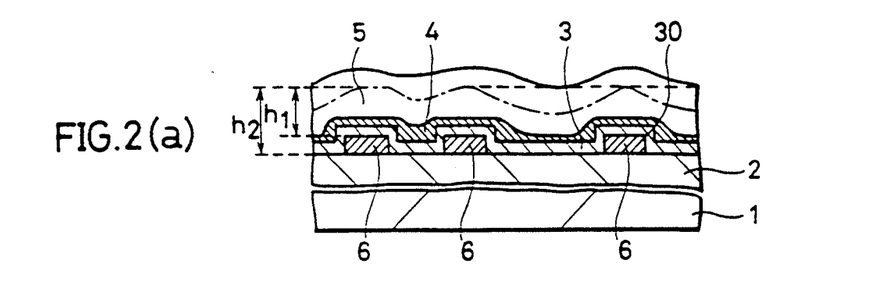
FIGS. 2(a)–(e) are a partial cross-sectional view of a semiconductor device showing each process in order in a manufacturing method according to another embodiment of the present invention.

Referring to FIG. 2(a), a semiconductor substrate 1 including an element (not shown) is prepared. An underlying insulating film 2 is formed on semiconductor substrate 1 so as to cover the element. A lower interconnection layer 6 which is an aluminum interconnection to be electrically connected to the element is formed on underlying insulating film 2, having a pattern 30 of stepped portions. A silicon oxide film as a lower interlayer insulating film 3 is deposited on underlying insulating film 2 by CVD so as to cover pattern 30 of lower interconnection layer 6. An SOG film 4 is applied so as to fill in recessed portions on the surface of lower interlayer insulating film 3.

Thereafter, a silicon oxide film as an upper interlayer insulating film 5 is deposited by CVD. Upper interlayer insulating film 5 has a height $h_1$ (1 μm when the height of lower interconnection layer 6 is 1 μm) relative to the surface of the stepped portion of pattern 30, which is required for insulating and isolating lower interconnection layer 6 and an upper interconnection to be formed later from each other. Upper interlayer insulating film 5 has a height $h_2$ of 2 μm or above relative to the surface of underlying insulating film 2. In this case, the expression "height" instead of "thickness" is used in order to indicate the thickness of upper interlayer insulating film 5 based on the surfaces of the stepped portion and underlying insulating film 2 regardless of the presence of lower interlayer insulating film 3 and SOG film 4, which also serve as interlayer insulating films for insulating and isolating the upper interconnection and the lower interconnection from each other.

Figure 2B:
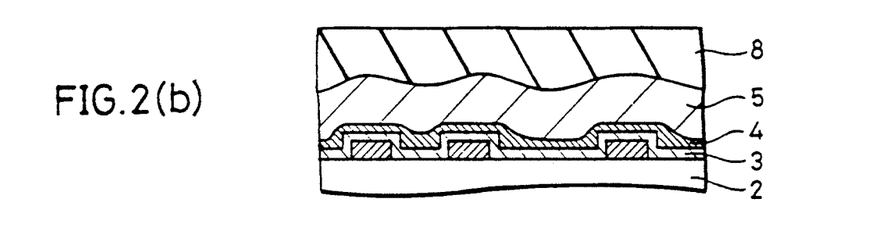

Referring to FIG. 2(b), upper interlayer insulating film 5 is coated with a silicon ladder resin film 8 having the structural formula (1) so as to fill in the recessed portions on the surface of upper interlayer insulating film 5. Silicon ladder resin film 8 is cured at a temperature of about 250° C. This curing provides an even surface of silicon ladder resin film 8.

Figure 2C:
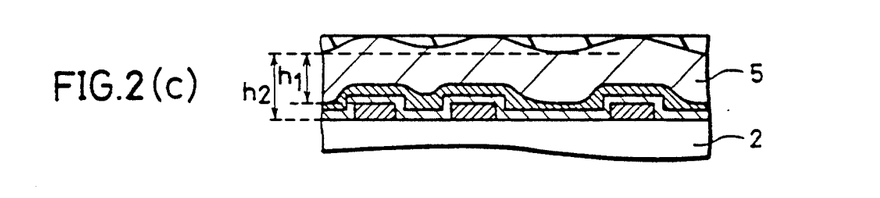
Figure 2D:
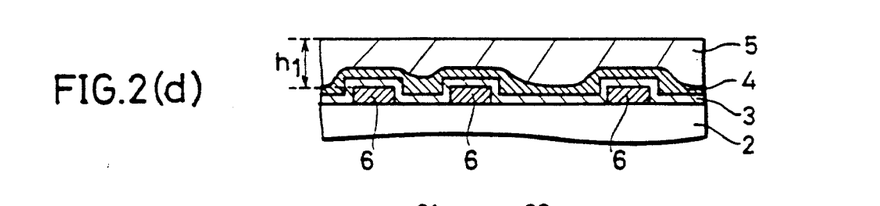

Referring to FIG. 2(b), (c) and (d), etching back is performed by anisotropic dry etching (plasma etching using $CHF_3+O_2$). The etching back is performed until upper interlayer insulating film 5 attains a minimum height $h_1$, i.e., 1 μm, which is required for insulating arid isolating lower interconnection layer 6 and an upper interconnection layer to be formed later from each other. Since the etching rates of silicon ladder resin film 8 and upper interlayer insulating film 5 are the same, an even surface of upper interlayer insulating film 5 is obtained after etching back.

Figure 2E:
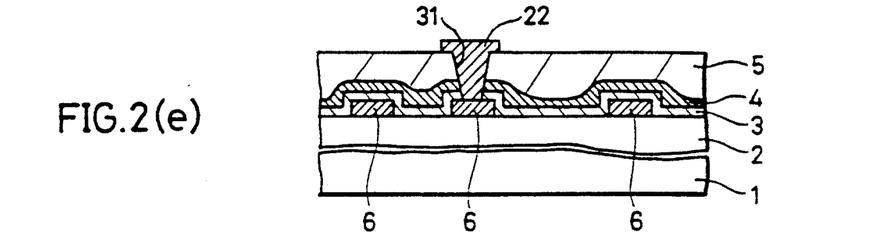

Referring to FIG. 2(e), a via hole 31 for exposing part of the surface of lower interconnection layer 6 is formed in the silicon type insulting films (3, 4 and 5) serving as interlayer insulating films. An upper interconnection layer 22 electrically connected to lower interconnection layer 6 is formed on the silicon type insulating films (3, 4 and 5). As the surface of the interlayer insulating film is flat, the accuracy of working upper interconnection layer 22 is improved.

EMBODIMENTS 4 and 5

Embodiments 4 and 5 are used for cases where a silicon ladder resin film is used for part or the entire portion of an interlayer insulating film, and have been made for solving the following problems in the prior art as stated below.

Figure 3:
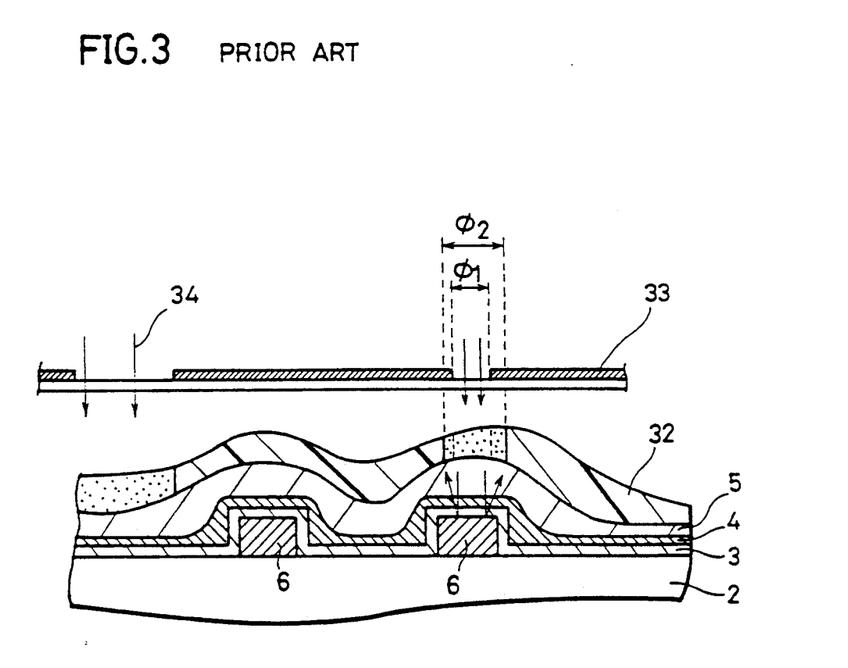
FIG. 3 is a cross-sectional view of a semiconductor device for describing a problem in forming a via hole in a conventional method.

FIG. 3 is a partial cross-sectional view of a semiconductor device for describing a problem in forming a via hole in the prior art.

Referring to FIG. 3, a lower aluminum interconnection layer 6 is formed on an underlying insulating film 2. A lower interlayer insulating film 3 is formed on underlying insulating film 2 so as to cover lower aluminum interconnection layer 6. An SOG film 4 is provided so as to fill in a recessed portion of lower interlayer insulating film 3. An upper interlayer insulating film 5 is provided on SOG film 4. A positive type photoresist 32 is provided on upper interlayer insulating film 5. 33 represents a photomask. FIG. 3 shows formation of an aperture portion in positive type photoresist 32, which is necessary for forming a via hole in the interlayer insulating films (3, 4 and 5).

In the conventional art, ultraviolet rays 34 which have entered positive type photoresist 32 through photomask 33 penetrate the interlayer insulating films (3, 4 and 5) and are reflected from lower aluminum interconnection layer 6 which is a high reflecting film. This phenomenon of reflection is called "halation" of ultraviolet rays. There was a problem that if an aperture portion having a diameter of $\phi_1$ was to be formed, an aperture portion having a diameter of $\phi_2$ larger than $\phi_1$ was obtained under the influence of the halation of ultraviolet rays, so that a dimensional accuracy of a finished via hole was decreased.

The embodiments 4 and 5 have been made for solving such a problem.

EMBODIMENT 4

The embodiment 4 is applied in a case where a silicon ladder resin film is used for the entire interlayer insulating film.

FIG. 4 is a partial cross-sectional view of a semiconductor device showing each process in order according to a method of manufacturing the semiconductor device in the embodiment 4.

Figure 4A:
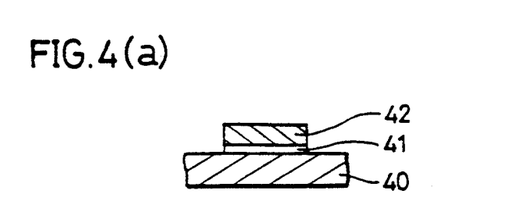
FIGS. 4(a)–(g) are a partial cross-sectional view of a semiconductor device showing each process in order in a manufacturing method according to still another embodiment of the present invention.

Referring to FIG. 4(a), a barrier metal layer 41 including titanium nitride is deposited by sputtering or an RTP process on a silicon substrate (or a silicon type underlying insulating film) 40 having a semiconductor element (not shown) formed thereon. Barrier metal layer 41 is formed for preventing Si of an Al-Si-Cu alloy film 42 to be formed next from being deposited on the surface of silicon substrate 1. Al-Si-Cu alloy film 42 is deposited on barrier metal layer 41 by sputtering. Then, barrier metal layer 41 and Al-Si-Cu alloy film 42 are patterned by photolithography.

Figure 4B:
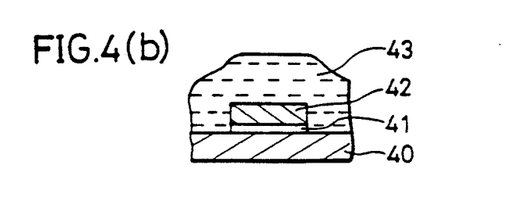

Referring to FIG. 4(b), an interlayer insulating film 43 is formed on silicon substrate 1 so as to cover Al-Si-Cu alloy film 42. As interlayer insulating film 43, a silicon ladder resin was used, having 20 to 120 weight % of UV absorbent added thereto and with the following structural formula. If the amount of the UV absorbent contained is 20 wt % or less, the capacity for reducing transmission of ultraviolet rays is decreased while if the amount of the UV absorbent contained is above 120 wt %, a uniform thickness can not be obtained.

where $R_1$ is at least one of a phenyl group and a lower alkyl group, $R_2$ is at least one of a hydrogen atom and a lower alkyl group, and n is an integer of 20 to 1000.

Preferably, there is used as the uv absorbent a dyestuff such as PC-Red-212P, PC-Yellow-2P or a pigment such as CROMOPHTAL-Scarlet-R, CROMOPHTAL-Scarlet-RN, CROMOPHTAL-RED-G, CROMOPHTAL-Scarlet-BR, CROMOPHTAL-Yellow-A2R, CROMOPHTAL-Orange-2G, CROMOPHTAL-orange-4R, CROMOPHTAL-Brown-5R, CROMOPHTAL-Yellow-3G, CROMOPHTAL-Yellow-GR, IRGAZIN-Yellow-2RLT, IRGAZIN-Yellow-3RLTN, IRGAZIN-Yellow-2GLT, IRGAZIN-Yellow-2GLTS, CROMOPHTAL-Yellow-8G, CROMOPHTAL-Yellow-6G.

Interlayer insulating film 43 is cured at a temperature of about 250° C., thereby making its surface even.

Figure 4C:
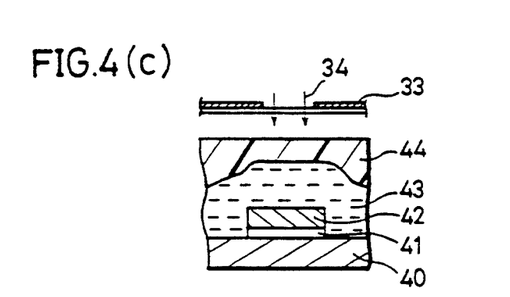

Referring to FIG. 4(c), a positive type photoresist film 44 is formed on interlayer insulating film 43.

Figure 4D:
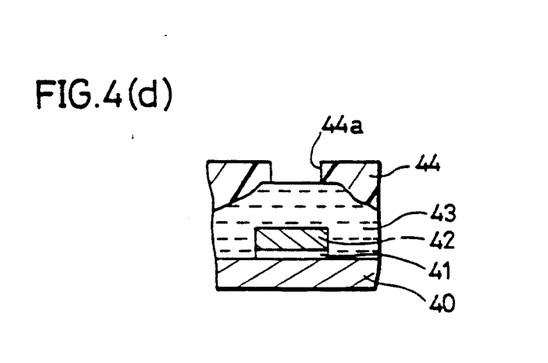

Referring to FIG. 4(c) and (d), an aperture portion 44a necessary for forming a via hole is made in positive type photoresist 44 by photolithography using a mask 33.

Figure 4E:
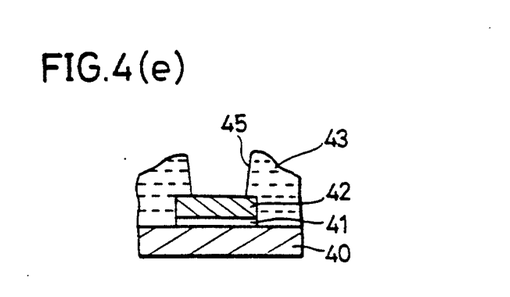

Referring to FIG. 4(d) and (e), interlayer insulating film 43 is selectively etched using the pattern of positive type photoresist 44 as a mask by a combination of wet etching with an aqueous solution of hydrofluoric acid and reactive ion etching using $CHF_3$ and $O_2$ as main component gases. This selective etching forms a via hole 45 for exposing part of the surface of Al-Si-Cu alloy film 42 in interlayer insulating film 43. Thereafter, the remaining photoresist and a reaction product generated in etching interlayer insulating film 43 are removed by a wet chemical treatment using organic alkali and rinsing with water.

Referring to FIG. 4(e), at the time of the etching, the surface of Al-Si-Cu alloy film 42 has an affected layer of Al formed by exposure to plasma of $CHF_3$ and $O_2$ gases. In order to remove the affected layer of Al, the surface of Al-Si-Cu alloy film 42 is sputter etched by Ar ions.

Figure 4F:
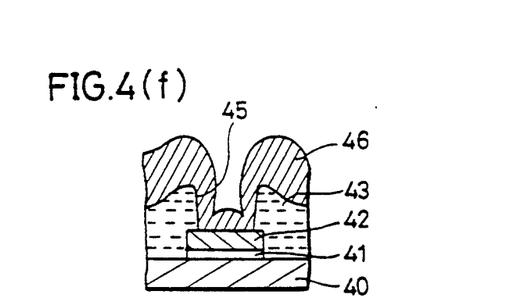

Referring to FIG. 4(f), an Al-Si-Cu alloy film 46 is deposited on interlayer insulating film 43 by sputtering so as to fill in via hole 45.

Figure 4G:
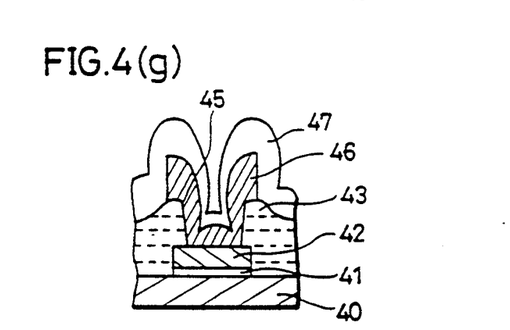

Referring to FIG. 4(g), a photoresist film (not shown) is formed on Al-Si-Cu alloy film 46 and patterned by photolithography. Al-Si-Cu alloy film 46 is patterned, for example, by plasma etching using the obtained resist pattern as a mask. Thereafter, the photoresist film is removed to obtain a pattern of Al-Si-Cu alloy film 46 serving as an upper interconnection layer. Then, the entire wafer is thermally treated at 400° to 450° C. Al-Si-Cu alloy film 42 as the lower interconnection layer is electrically connected to Al-Si-Cu alloy film 46 serving as the upper interconnection layer through via hole 45 by this thermal treatment. Thereafter, a passive-Lion film 47 is deposited over silicon substrate 40 by CVD.

Referring to FIG. 4(c), in accordance with this embodiment, since the UV absorbent is added in the silicon ladder resin film of interlayer insulating film 43, the ultraviolet rays 34 passing through positive type photoresist 44 are absorbed by the UV absorbent in interlayer insulating film 43 and do not reach Al-Si-Cu alloy film 42 of the high reflecting film. Accordingly, halation of the ultraviolet rays can be efficiently avoided. Additionally, Referring to FIG. 4(d), aperture portion 44a having the same diameter as that of the aperture portion of photomask 33 can be made in positive type photoresist 44. Furthermore, referring to FIG. 4(e), via hole 45 can be obtained with high dimensional accuracy.

EMBODIMENT 5

FIG. 5 shows an embodiment applied in a case where a silicon ladder resin film including a uv absorbent is used as part of an interlayer insulating film.

Figure 5A:
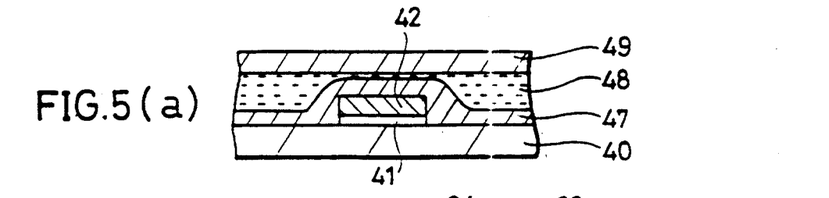
FIGS. 5(a)–(f) are a partial cross-sectional view of a semiconductor device showing each process in order in a manufacturing method according to yet another embodiment of the present invention.

Referring to FIG. 5(a), an Al-Si-Cu alloy film 42 (lower interconnection layer) is formed over a silicon substrate 40 with a barrier metal layer 41 interposed therebetween. A silicon oxide film serving as a lower interlayer insulating film 47 is so formed as to cover Al-Si-Cu alloy film 42. A silicon ladder resin film 48 having the above-mentioned UV absorbent added therein is applied to fill in recessed portions on the surface of lower interlayer insulating film 47. At this time, it is important to apply silicon ladder resin film 48 so that it also remains above Al-Si-Cu alloy film 42.

An upper interlayer insulating film 49 of a silicon oxide film is formed on silicon ladder resin film 48.

Figure 5B:
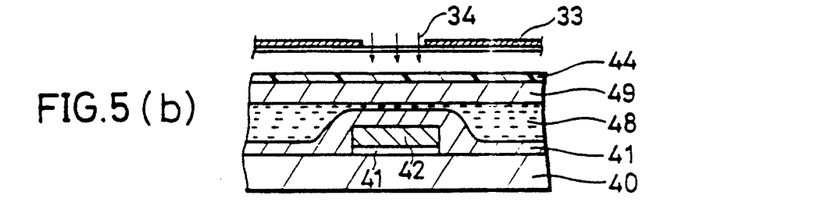

Referring to FIG. 5(b), a resist 44 is formed on upper interlayer insulating film 49.

Figure 5C:
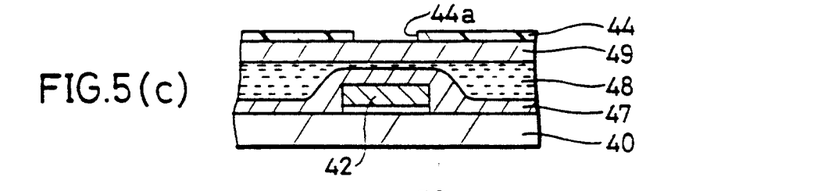

Referring to FIG. 5(b) and-(c), an aperture portion 44a necessary for forming a via hole is formed in photoresist 44 by lithography using a photomask 33.

Figure 5D:
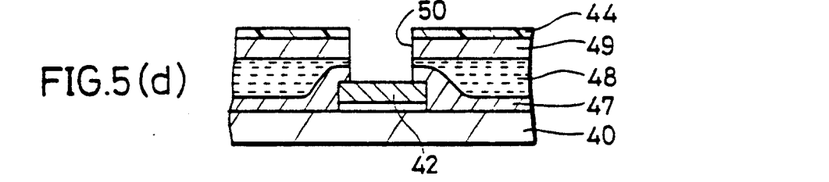

Referring to FIG. 5(c) and (d), the interlayer insulating films (47, 48 and 49) are etched using photoresist 44 having aperture portion 44a as a mask to form a via hole 50 for exposing part of the surface of Al-Si-Cu alloy film 42. Photoresist 44 is then removed.

Figure 5E:
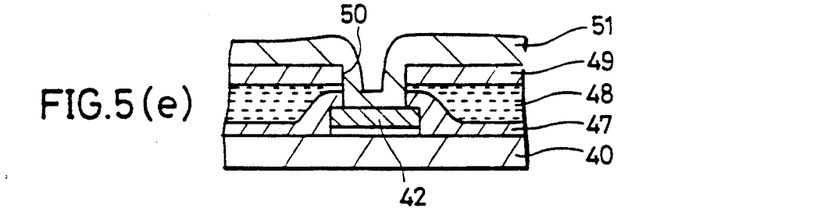

Referring to FIG. 5(e), an upper aluminum interconnection layer 51 to be electrically connected to Al-Si-Cu alloy film 42 through via hole 50 is formed on upper interlayer insulating film 49.

Figure 5F:
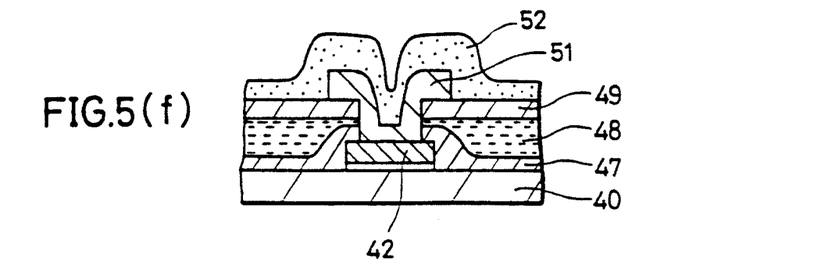

Referring to FIG. 5(f), upper aluminum interconnection layer 51 is patterned and then, a passivation film 52 is formed on upper interlayer insulating film 49 so as to cover upper aluminum interconnection layer 51.

Referring to FIG. 5(b), in accordance with this embodiment, ultraviolet rays 34 directed to photoresist 44 go through photoresist 44 and upper interlayer insulating film 49 and hit silicon ladder resin film 48 including the UV absorbent. At this time, the ultraviolet rays 34 are absorbed by the Uv absorbent contained in silicon ladder resin film 48 and do not reach Al-Si-Cu alloy film 42. Accordingly, halation of the ultraviolet rays is avoided and the dimensional accuracy of the diameter of the via hole is not decreased. As a result, an effect of obtaining a highly reliable semiconductor device can be achieved.

As described above, in accordance with a semiconductor device according to the present invention, since an interlayer insulating film for insulating and isolating a lower interconnection and an upper interconnection formed over the lower interconnection has an even surface, the upper interconnection layer can be obtained with high working accuracy, thereby making the semiconductor device highly reliable.

In accordance with the method of manufacturing a semiconductor device according to the present invention, as an interlayer insulating film having an even surface can be obtained, an upper interconnection layer can be formed with accuracy. As a result, a highly reliable semiconductor device can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including an interlayer insulating film for insulating and isolating a lower interconnection and an upper interconnection formed over the lower interconnection from each other, comprising:

a semiconductor substrate including an element;

a lower interconnection layer provided on said semiconductor substrate having a pattern of stepped portions and electrically connected to said element;

a silicon type insulating film provided on said semiconductor substrate so as to cover said lower interconnection layer, the surface of said silicon type insulating film including recessed portions above regions between the stepped portions of said pattern;

a silicon ladder resin film filled in said recessed portions of said silicon type insulating film for making even the surface of said silicon type insulating film;

a via hole formed in said silicon type insulating film for exposing part of the surface of said lower interconnection layer; and an upper interconnection layer provided on said silicon type insulating film and electrically connected to said lower interconnection layer through said via hole, said silicon ladder resin film having the structural formula:

where $R_1$ is at least one of a phenyl group and a lower alkyl group, $R_2$ is at least one of a hydrogen atom and a lower alkyl group, and n is an integer of 20 to 1000.

2. The semiconductor device according to claim 1, wherein said lower interconnection layer includes an aluminum interconnection layer.

3. A semiconductor device including an interlayer insulating film for insulating and isolating a lower interconnection and an upper interconnection formed over the lower interconnection from each other, comprising:

a semiconductor substrate including an element;

a lower interconnection layer provided on said semiconductor substrate and electrically connected to said element;

a silicon type insulating film provided on said semiconductor substrate so as to cover said lower interconnection layer;

a silicon ladder resin film provided so as to cover said silicon type insulating film and having a uv absorbent added therein for making even the surface of said silicon type insulating film;

a via hole penetrating said silicon ladder resin film and said silicon type insulating film for exposing part of the surface of said lower interconnection layer; and an upper interconnection layer provided on said silicon ladder resin film and electrically connected to said lower interconnection layer through said via hole, said silicon ladder resin film having the general structural formula:

where $R_1$ is at least one of a phenyl group and a lower alkyl group, $R_2$ is at least one of a hydrogen atom and a lower alkyl group, and n is an integer of 20 to 1000.

4. A semiconductor device including an interlayer insulating film for insulating and isolating a lower interconnection and an upper interconnection formed over the lower interconnection from each other, comprising:

a semiconductor substrate including an element;

a lower interconnection layer provided on said semiconductor substrate and electrically connected to said element;

a silicon ladder resin film provided on said semiconductor substrate so as to cover said lower interconnection layer and having a uv absorbent added therein;

a via hole provided in said silicon ladder resin film for exposing part of the surface of said lower interconnection layer; and an upper interconnection layer provided on said silicon ladder resin film and electrically connected to said lower interconnection layer through said via hole, said silicon ladder resin film having the general structural formula:

where $R_1$ is at least one of a phenyl group and a lower alkyl group, $R_2$ is at least one of a hydrogen atom and a lower alkyl group, and n is an integer of 20 to 1000.

5. The semiconductor device according to claim 4, wherein said UV absorbent is a dyestuff which absorbs a ultraviolet light in the range of 200 to 500 nm.

6. The semiconductor device according to claim 4, wherein said UV absorbent is a pigment which absorbs a ultraviolet light in the range of 200 to 500 nm.

7. The semiconductor device according to claim 4, wherein the amount of said UV adsorbent contained is in the range of 20 to 120 wt %.

* * * * *